United States Patent [19]

Marshall, III et al.

[11] 4,083,044
[45] Apr. 4, 1978

[54] UNIPOLAR WIDE-RANGE CURRENT-TO-FREQUENCY CONVERTER

[75] Inventors: J. Howard Marshall, III, Pasadena; Timothy M. Harrington, Sierra Madre, both of Calif.

[73] Assignee: MDH Industries Inc., Monrovia, Calif.

[21] Appl. No.: 665,385

[22] Filed: Mar. 10, 1976

[51] Int. Cl.² .......................................... H03K 13/20
[52] U.S. Cl. ...................... 340/347 AD; 340/347 NT
[58] Field of Search .... 340/347 M, 347 AD, 347 NT; 307/271

[56] References Cited

U.S. PATENT DOCUMENTS 3,688,305   8/1972   Goldsworthy ............... 340/347 AD

OTHER PUBLICATIONS

Rogers "The Review of Scientific Instruments" vol. 34, No. 6, Jun. 1963, pp. 660–663.
Furuta "The Review of Scientific Instruments" vol. 41, No. 1, Jan. 1970, pp. 11–15.

Primary Examiner—Charles D. Miller
Attorney, Agent, or Firm—Arthur V. Doble

[57] ABSTRACT

In a unipolar version of an analog-to-digital converter of low-level signals involving a self-zeroing current-to-frequency converter, which virtually eliminates the effects of voltage offsets at the input to the converter while avoiding large leakage currents, improved circuitry is provided in order to avoid paralysis of the converter which could be caused by small input currents or charges of polarity opposite to that of the normal signal current or by drifts in the converter input voltage which produce a negative-charge offset. The circuitry includes provision for the automatic introduction at the converter input of a relatively-large restoration current with the same polarity as the signal current, and this current can also be used for converter checking and calibration. One version of this circuitry involves exposing a junction diode at the converter input to light, causing it to act as a photodiode. One easily controlled source of such light may be a light-emitting diode conducting a suitable current placed in close proximity to the junction diode within the same enclosure. When the junction diode forms a part of a secondary feedback loop used during the discharge period of a primary capacitive feedback, then exposing it to light speeds up the secondary feedback, thereby reducing converter dead time. Other devices may be used for current introduction at the converter input, including a mechanical switch, but they are less preferable from the standpoint of leakage current, size and speed of response.

8 Claims, 4 Drawing Figures

UNIPOLAR WIDE-RANGE CURRENT-TO-FREQUENCY CONVERTER

BACKGROUND OF THE INVENTION

1. Field of the Invention

This invention relates to apparatus for electronic signal processing and more particularly to improved analog-to-digital conversion by apparatus for providing wide-range current-to-frequency conversion in circuits with very-low input currents on the order of $1 \times 10^{-14}$ A which flow in only one direction.

2. Description of the Prior Art

A common problem in constructing various electronic instruments is the quantization of a continuously-varying current or voltage so that subsequent digital data-processing systems can generate useful information based on such analog inputs. This analog-to-digital conversion becomes particularly difficult when the inputs vary over a wide dynamic range, such as $10^7$:1, and when high accuracy must be maintained for very small currents, approaching $10^{-14}$ A. Unique techniques must be employed whenever circuit simplicity, low-power consumption and a low cost are also important.

Small input currents varying over a wide range are commonly produced by many devices such as, for example, ionization chambers used for radiation dosimetry or gas chromatography, photomultiplier tubes viewing light sources of widely-varying intensities, electrodes for collecting free ions or electrons in mass spectrometers or electrostatic analyzers, and large-value resistors for high-impedance voltage measurements.

The output signals from a quantizer handling such input currents generally enter digital data-processing circuits, which may in turn also control the quantizer. These circuits can perform such functions as determining and possibly displaying the instantaneous or average frequency which is proportional to the input current, the total number of pulses produced in a defined time interval which is proportional to the total charge (equal to the integral of the current) applied to the input during the interval, the time during which the frequency and thus the input current exceeds some fixed or adaptive threshold, or any other function commonly performed by digital or analog circuits.

A common application for this type of quantizer involves a small open ion chamber used in a radiation dosimeter which must be small, portable and capable of operating accurately for an extended period of time from batteries. Such an ion chamber will typically produce currents between $3 \times 10^{-14}$ A and $1.8 \times 10^{-7}$ A for the expected range of dose rates (1 mR/min to 6000 R/min) and total charges in a 1.2-s interval from $3.6 \times 10^{-14}$ C to $2.4 \times 10^{-8}$ C, corresponding to a total dose from 0.02 mR to 13 R. A simple, low-power converter with a minimum of controls and adjustments must quantize these currents for processing by subsequent circuits employing mostly CMOS digital integrated circuits.

U.S. Pat. No. 3,921,021, whose inventor is also one of the applicants herein, describes an improved wide-range current-to-frequency converter for use in circuits with input currents as low as $10^{-14}$ A. The system of circuitry operates as an analog-to-digital converter to produce an output frequency proportional to input current. The current-to-frequency converter enables digitization of an input signal by producing a train of discrete output pulses with a repetition frequency proportional to current applied to the input of the converter. The circuit utilizes a low-leakage charge-sensitive amplifier, a gated multivibrator, a charge pulser and a capacitive divider. The gated multivibrator under the control of the charge-sensitive amplifier at the input of the converter produces discrete pulses, which in turn cause the charge pulser to generate discrete units of charge, which are reduced in magnitude by the capacitive divider to become the charge-feedback pulses applied to the input of the charge-sensitive amplifier. This amplifier compares the feedback current consisting of repetitive charge-feedback pulses with the input current to the converter, and controls the gated multivibrator so that the pulse repetition rate varies in an appropriate manner to keep the feedback current equal to the instantaneous value of the input current, resulting in the repetition frequency of the gated-multivibrator pulses becoming a digital representation of the analog input current. This technique can provide a dynamic range of $10^7$:1 and can handle input currents as small as $10^{-14}$ A directly without preceding electrometer amplifiers, whenever the input stage to the charge-sensitive amplifier contains a pair of MOSFETs. The circuitry also provides a mechanism for discharging the capacitive divider through a restoration diode at the converter input in a manner such that the circuit automatically establishes its own zero level.

The converter described in U.S. Pat. No. 3,921,021 has an embodiment which is intended for input currents flowing in one direction only. Such a unipolar converter is considerably simpler than the bipolar versions, and, because many of the devices generating signal currents are inherently unipolar, it is clearly advantageous to use the simpler unipolar converter with them. In this type of converter, however, because charges applied to the converter input in the opposite sense to that of the normal input current will not be nullified during the discharge period of the capacitive divider, the converter will accumulate an opposite-polarity offset corresponding effectively to a suppressed zero whenever such charges or currents are present without a significant normal input current.

For the sake of clarity in description only, consider the case where the normal input current flows from a signal device toward the converter, wherein this direction is defined as "positive." For this case the opposite-polarity offset arises because the capacitance at the converter input becomes charged negatively with respect to its proper reference voltage, and, until positive signal current flows for a sufficiently long time to recharge this capacitance back to the normal reference voltage, a unipolar converter will not produce output pulses indicative of the flow of signal current. Clearly the same principle applies to the opposite case, and this invention is not limited to such positive signal-current flow.

Such negative offsets can arise from several sources. For example, the offset voltage at the converter input could be positive with respect to nearby conductors, and current flow through leakage resistances to these conductors is in the negative sense. The input restoration diode provides one such leakage path, as may the gate-drain resistance of the input MOSFET. Alternatively, the relative values of the gate-source voltages of the two MOSFETs at the converter input may change slightly with time or temperature. If as a result the input voltage for current balance in the charge-sensitive amplifier rises, then effectively a negative charge has been added to the input capacitance, resulting in an undesirable negative offset. Finally negative charges can be introduced through the converter input itself by such nonstandard operations as connecting and diconnecting the signal-generating device or by resetting the converter in the presence of high noise levels, where the converter essentially sets its operating baseline at the peaks of noise-produced transients producing a negative offset.

SUMMARY OF THE INVENTION

Applicants herein have conceived of an invention which solves this negative-offset problem in unipolar converters of the type described in U.S. Pat. No. 3,921,012. In this present invention a large positive current is introduced through a switch at the converter input during a reset interval when the converter output is ignored. As a result the restoration diode at the converter input is always forced into conduction during this reset interval, even if the input capacitance is initially charged in the negative direction. Then the converter reestablishes its correct operating zero level even in the presence of such negative offsets. If the converter output is not ignored during the introduction of this current, then the response of the converter to this current can be used to verify proper circuit operation.

For converters measuring currents as small as $10^{-13}$ A, the introduction of this current through a switch presents the problem of errors produced by leakage effects in the switch itself. One type of low-leakage switch is a reed relay, which has disadvantages involving leakage currents, strain currents, cleanliness, response time, operating life, size and power consumption. Often a better method of current introduction involves the exposure of the restoration diode to light of the proper wavelengths to cause the diode to act simultaneously as a photodiode. As a result, it becomes conductive in both directions, also properly restoring the converter zero level even in the presence of negative offsets. If the restoration diode forms a part of a negative-feedback loop around the charge-sensitive amplifier at the converter input, which is gated on only during the reset interval, then this loop will keep the currents in the input MOSFETs balanced even during this reset interval, thus improving the stability of the input voltage determined by the match of the gate-source voltages of the input MOSFETs.

The present invention provides novel features over all known prior art, and it is an object of this invention to provide an improved unipolar wide-range current-to-frequency converter which is immune to opposite-polarity input currents and charges.

It is an object of this invention to provide for the immunity of a unipolar current-to-frequency converter to opposite-polarity offsets by introducing a normal-polarity input current during a reset interval when the converter establishes its proper operating levels and its output signal is ignored.

It is an object of this invention to generate a normal-polarity input current which provides immunity for a unipolar current-to-frequency converter against opposite-polarity offsets using the exposure of the input restoration diode to light during a reset interval when the converter establishes its proper operating levels and its output signal is ignored.

It is an object of this invention to include the restoration diode, on which light is flashed during the reset interval in order to provide immunity against opposite-polarity offsets in a unipolar current-to-frequency converter, within a negative-feedback loop which is switched on during the reset interval in order to improve the stability of the input voltage of the converter and to decrease the required duration of the reset interval.

It is another object of this invention to provide a mechanism for introducing a current at the input to a current-to-frequency converter during times of normal operation in order to verify proper operation of the converter.

For a better understanding of the present invention, together with other and further objects thereof, reference is made to the following description taken in connection with the accompanying drawings in which preferred embodiments of the invention are illustrated, the scope of the invention being pointed out and contained in the appended claims.

DESCRIPTION OF THE PREFERRED EMBODIMENT

Figure 1:
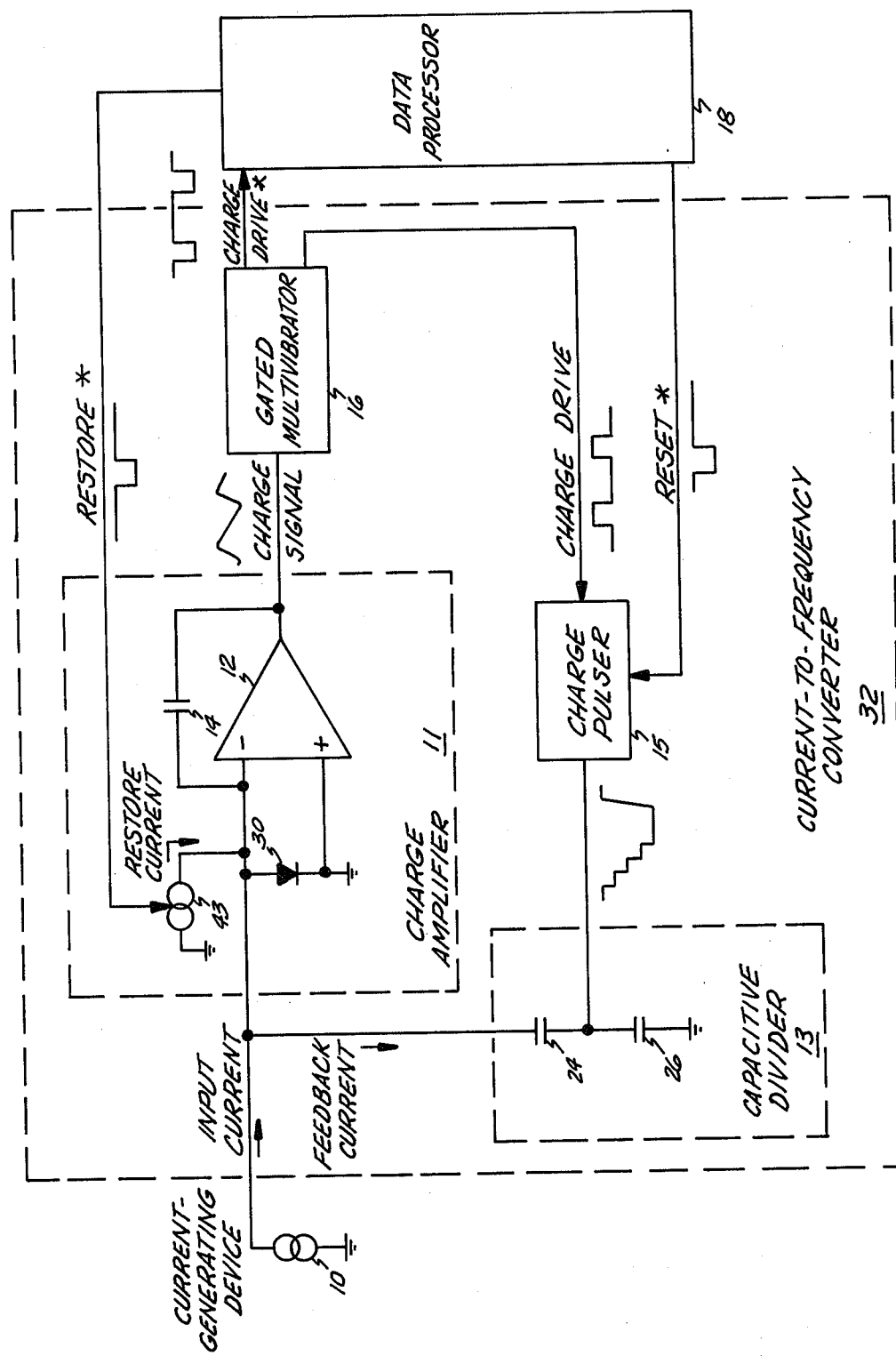
FIG. 1 is a circuit diagram of one embodiment of the unipolar wide-range current-to-frequency converter for general application with a source of current for restoring the input in the presence of opposite-polarity offsets.

Turning to FIG. 1, there is shown in block-diagram form an embodiment of this current-to-frequency converter 32. The converter 32 contains a charge amplifier 11, which produces the CHARGE SIGNAL at its output in response to the RESTORE CURRENT and the INPUT CURRENT from the current-generating device 10 and in response to the FEEDBACK CURRENT flowing through the capacitive divider 13 connected to the charge-amplifier 11 input. The charge amplifier 11 consists of an operational amplifier 12 with feedback through capacitor 14 and with a restoration diode 30 at the input. Also included in the charge amplifier 11 is a source of current 43, which can be turned on by an external signal generating the RESTORE CURRENT. Other embodiments of a charge amplifier performing the same functions as those described herein are also known to those skilled in the art.

In the embodiment shown in FIG. 1, the INPUT CURRENT and the RESTORE CURRENT flow toward the charge-amplifier input and the FEEDBACK CURRENT flows away from this input. It is obvious to those skilled in the art that the sign of all of these currents could be reversed with appropriate changes in circuit details. It is also obvious to those skilled in the art that the current-generating devices 10 and 43 could be voltage-generating devices in series with large impedances, such as resistors of appropriate values.

As shown in FIG. 1, the INPUT CURRENT causes the CHARGE SIGNAL at the output of the amplifier 12 to move negatively until the gated multivibrator 16 triggers. At that time this circuit generates a positive pulse of fixed duration on the CHARGE-DRIVE line. The use here of a positive signal of fixed duration is for purposes of illustration only and is not an essential part of this invention. The logical complement of the CHARGE-DRIVE signal appears as the CHARGE-DRIVE* signal and signifies to the data processor 18 that the gated multivibrator 16 triggered. The pulse repetition rate on the CHARGE-DRIVE line or on other lines logically related to the CHARGE-DRIVE line, such as the CHARGE-DRIVE* signal, contains the output frequency information from the current-to-frequency converter 32.

The CHARGE-DRIVE signal enters the charge pulser 15. Except when it is under control of the RESET* signal to be described later, the charge pulser 15 produces a defined increment of charge whenever a positive transition occurs in the CHARGE-DRIVE signal. This charge flows out of the capacitive divider 13, which contains the junction of capacitor 24 with capacitor 26. The other end of capacitor 26 is connected to ground potential, whereas capacitor 24 is connected to the input of the charge amplifier 11. Because the negative feedback through capacitor 14 causes the impedance at the input of the charge amplifier 11 to appear momentarily low, the charge produced by the charge pulser 15 divides between capacitor 24 and capacitor 26 in the ratio of their capacitances. If the capacitance of capacitor 24 is much smaller than that of capacitor 26, then only a small fraction of the charge-pulser 15 output enters the charge-amplifier 11 input through capacitor 24. As a result the FEEDBACK CURRENT may be much smaller than the currents involved in the charge pulser 15, and thus leakage currents and other such error-producing effects associated with the charge pulser 15, which may contain semiconductors, are attenuated by an amount which may exceed 10,000:1. The capacitive divider 13, which in itself may have impedances for direct currents exceeding $10^{14} \Omega$ and also very low leakage currents, has thus attenuated the deleterious leakage effects associated with semiconductors and other electronic components, which, if connected directly to the charge-amplifier 11 input, would prevent accurate operation for INPUT CURRENTS as small as $10^{-14}$ A.

In response to that portion of the charge-pulser 15 output signal coupled through capacitor 24 to the input of the charge amplifier 11, the CHARGE SIGNAL at the output of amplifier 12 rises rapidly. After a time interval equal to approximately twice the width of the positive pulse on the CHARGE-DRIVE line, the gated multivibrator 16 interrogates the CHARGE SIGNAL. If this signal has not risen sufficiently to exceed the threshold of the gated multivibrator 16, it proceeds to generate a second CHARGE-DRIVE pulse. This sequence continues until the output voltage of amplifier 12 rises above the threshold level.

Thus, the output of amplifier 12 oscillates about the threshold voltage of the gated multivibrator 16 such that the charge removed from the input of amplifier 12 through capacitor 24 equals the charge supplied at the input by the current-generating device 10. Whenever each positive transition of the CHARGE-DRIVE signal causes a fixed charge to be withdrawn from the amplifier 12 input, the repetition rate of CHARGE-DRIVE signals is proportional to the INPUT CURRENT.

The action of the overall feedback loop of the converter 32 causes the voltage across capacitor 26 to fall negatively. In order to avoid excessive voltages across capacitor 26 and the saturation of the charge pulser 15, the data processor 18 must occasionally interrupt the quantizing process in order to discharge the capacitors in the capacitive divider 13. At such times, the RESET* signal commands the charge pulser 15 to return its output to near ground potential, forcing a positive current through capacitor 24 into the charge amplifier 11. This relatively large current places the restoration diode 30 in conduction, which provides a dc path for the recharging of capacitor 24. After the current pulse in capacitor 24 dies away, diode 30 would stop conducting after drawing the input of amplifier 12 back toward its quiescent value, if the INPUT CURRENT and the RESTORE CURRENT are zero.

In that case, however, it is conceivable that the input voltage to the converter 32 is below the reference voltage of the operational amplifier 12 and that also the voltage across capacitor 24 is insufficient to overcome this offset voltage when the output of the charge pulser 15 returns to ground potential. Then the restoration diode 30 never conducts, and the voltage offset of the converter 32 remains or even grows larger if negative leakage currents exceed the INPUT CURRENT. In order to avoid the resulting offsets, a gated current-generating device 43 produces the RESTORE CURRENT during at least some of the reset intervals. The signal labelled RESTORE* from the data processor 18 can control the period during which the current-generating device 43 produces the RESTORE CURRENT. If the data processor 18 causes the RESTORE CURRENT to flow during periods other than the reset intervals, the converter 32 will analyze the RESTORE CURRENT as an INPUT CURRENT, with this mode providing a straight-forward method of calibrating or testing the converter 32.

Whenever the INPUT CURRENT and the RESTORE CURRENT are both near zero, the impedance of the restoration diode 30 becomes very high before the decay of the amplifier input voltage to its quiescent value is completed. Because this decay is only asymptotic, it often must be speeded up by a feedback mechanism. This speed up may be allowed to occur automatically in that the CHARGE SIGNAL at the output of amplifier 12 is below the threshold of the gated multivibrator 16 during the reset sequence, causing CHARGE-DRIVE pulses to be generated continuously at their maximum rate. These pulses will continue until the output of amplifier 12 returns to its quiescent value just above the threshold of the gated multivibrator 16. During this reset period, the data processor 18 should ignore the output of the current-to-frequency converter 32. Such a reset sequence should precede each integration interval.

The time required for this reset sequence, which is a time during which the current-to-frequency converter 32 is not processing an input signal, equals the sum of the time required for the charge pulser 15 to discharge the capacitive divider 13 and the time for the current produced by the gated multivibrator 16 and the charge pulser 15 operating at their maximum frequency to return the CHARGE SIGNAL at the output of amplifier 12 to its quiescent level. This latter time under some circumstances can lead to an excessive converter "dead-time," and thus a secondary feedback mechanism not shown in FIG. 1 is sometimes desirable for restoring normal converter operation more rapidly. One such technique involves connecting the cathode of diode 30 to the output of amplifier 12 while the capacitive divider 13 is being discharged, instead of to ground potential as shown in FIG. 1; during the normal conversion process the cathode of diode 30 is returned to ground potential. This modification of the basic reset sequence permits the output of amplifier 12 to restore rapidly its own input to near its quiescent value, substantially reducing the number of CHARGE-DRIVE pulses necessary to perform this function and thus eliminating one of the major sources of converter dead time.

Forcing the restoration diode 30 into heavier conduction using the RESTORE CURRENT also speeds up this secondary feedback loop because the impedance of the diode is reduced in proportion to the current flowing in it. In addition the existence of this secondary feedback loop makes it possible to use the restoration diode 30 itself as the gated current-generating device 43 producing the RESTORE CURRENT. In this embodiment, the junction of diode 30 is exposed to light during at least part of the reset sequence. This light will then cause the diode 30 to become a photodiode as well, producing a short-circuit current flowing in the opposite direction as that in a forward-biased diode and a voltage in the same sense as that of a forward-biased diode. This current permits the capacitance at the input of the converter 32 to be charged positively to remove any negative offsets which may be present. After the recharging of the input capacitance and the capacitive divider 13, the secondary feedback loop will bias the cathode of the restoration diode 30 sufficiently negatively to stop all current flow at the input to converter 32 when the INPUT CURRENT is zero.

Figure 2:
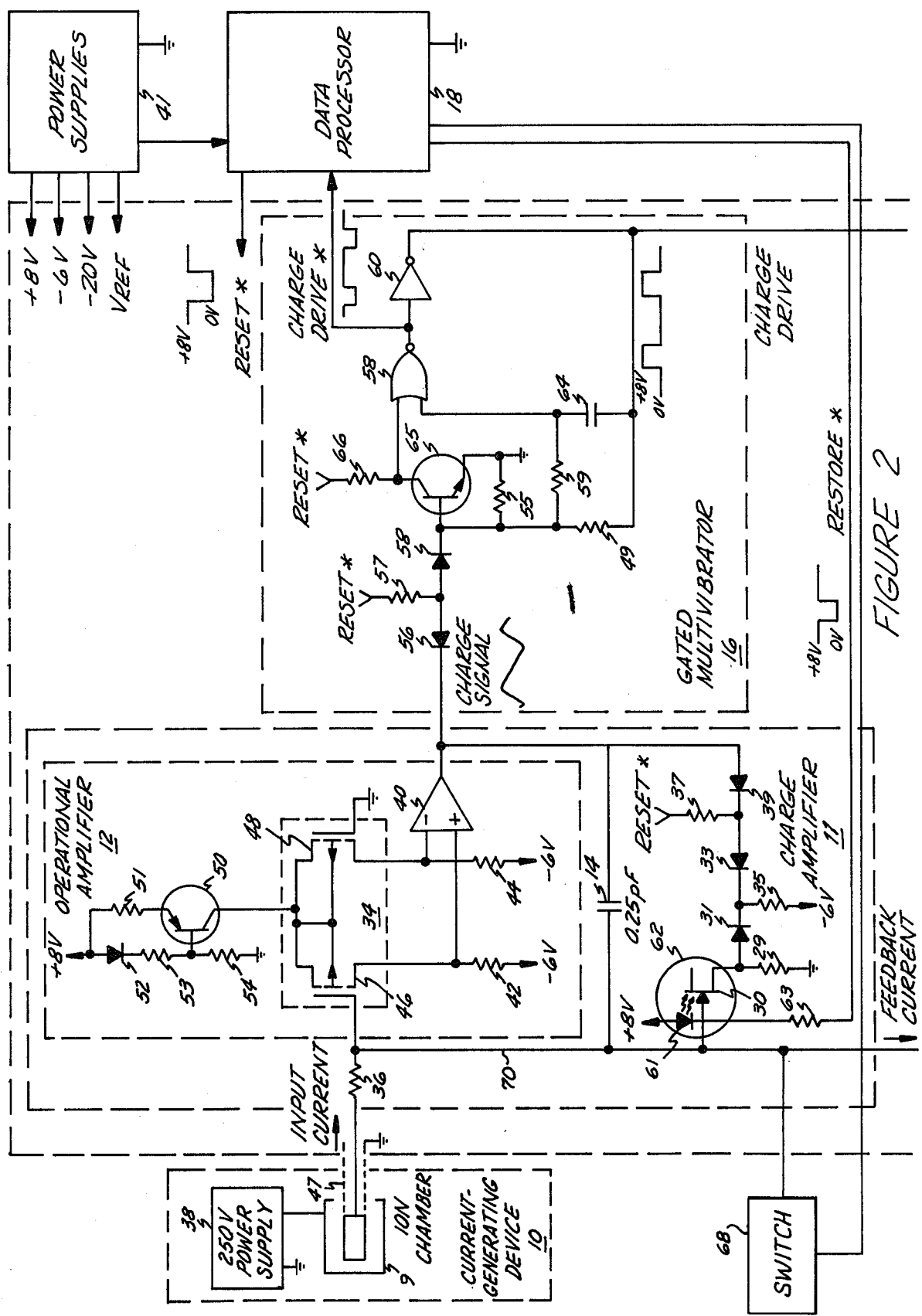
FIGS. 2 and 3, which are related to one another as shown in FIG. 4, together provide a circuit diagram of a system combining this converter, having a charge-sensitive amplifier, a gated multivibrator, a charge pulser, a capacitive divider and an input restoration diode exposed to light from a light-emitting diode and enclosed in a switched negative-feedback loop, with an ion chamber and a digital data processor used in radiation dosimetry.

In FIG. 2 there is shown an alternative method of generating the RESTORE CURRENT involves a mechanical switch 68, such as a reed relay, connecting a resistor to a source of potential which is positive with respect to the converter input. Switch 68 may be used through selection by the data processor 18 to introduce current to the node of circuit line 70 opposing that of the feedback current. This method produces essentially the same results as those produced by exposing the restoration diode 30 to light, although leakage currents, switching speed and size are disadvantages of the mechanical switch with respect to a photodiode, which need not be the restoration diode 30 itself. A mechanical switch, however, does have advantages with regard to the range and stability of the RESTORE CURRENT.

Both of these reset sequences have the property that the current-to-frequency converter 32 repeatedly establishes its own zero level at a rate given by the rate of occurrence of RESET* and RESTORE* pulses even in the presence of small opposite-polarity currents at the input to the converter 32. As a result, the converter 32 automatically nulls out the effects of varying offset voltages at its input at frequent intervals, allowing it to provide accurate operation over a dynamic range of $10^7:1$. If the operational amplifier 12 has a balanced input stage, then this nulling process forces the input to rest near ground potential, reducing leakage currents through diode 30, capacitor 24 and any other components connected between the input and ground potential. Thus, the use of capacitive divider 13 to introduce the FEEDBACK CURRENT, together with a reset sequence which automatically compensates for varying amplifier offset voltages of either sign and forces the converter 32 input to remain near ground potential, permits accurate operation over a wide range of INPUT CURRENTS, which may be as small as $10^{-14}$ A, without external zeroing circuits or electrometer amplifiers.

Figure 3:
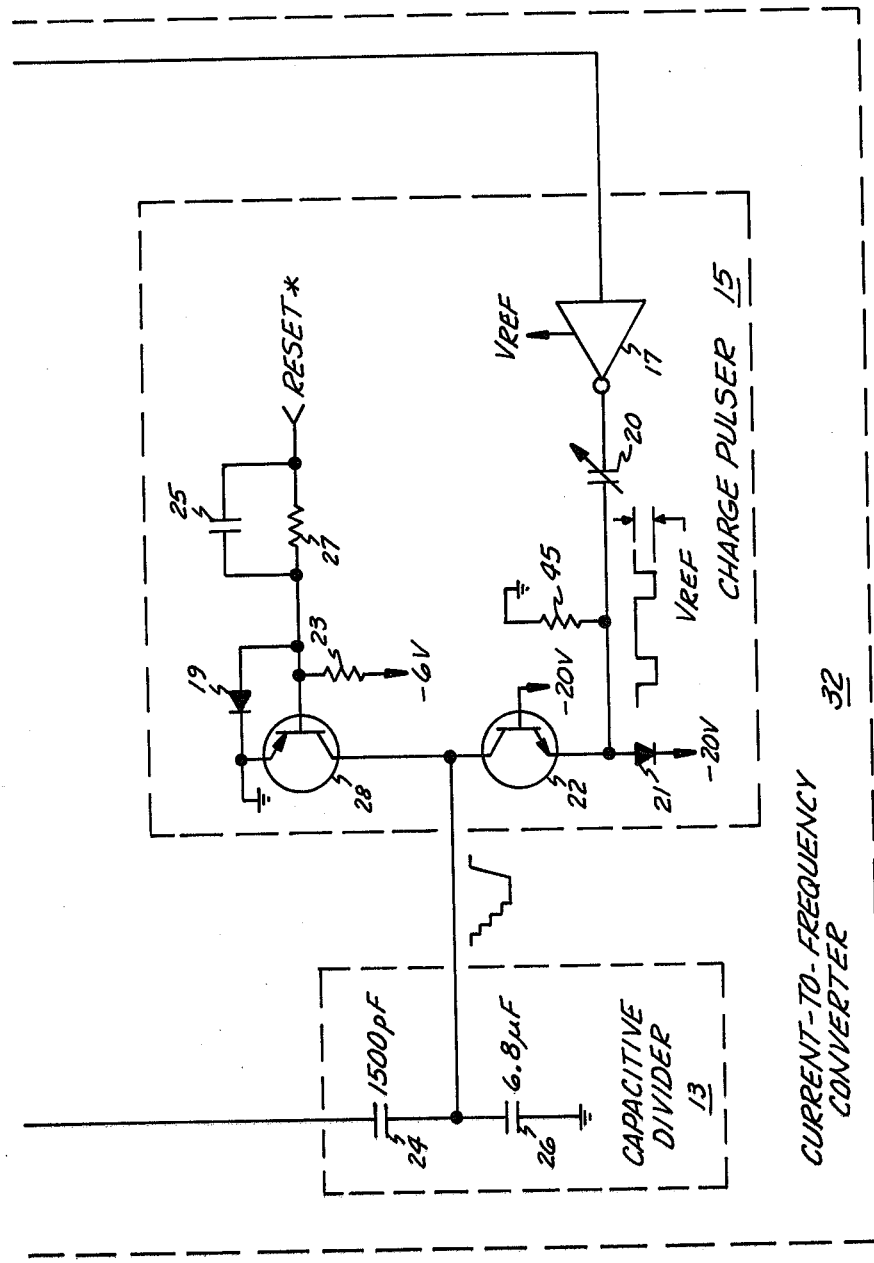

Turning now to FIGS. 2, 3, and 4, one sees the details of the charge amplifier 11, the gated multivibrator 16, the charge pulser 15 and the capacitive divider 13 described above as they were implemented in one embodiment of this type of current-to-frequency converter. FIG. 4 shows the relationship between FIGS. 2 and 3, which together constitute this embodiment. In addition, there is a light-emitting diode (LED) 61 mounted within the same enclosure 62 as the restoration diode 30, which in this case is a field-effect transistor (FET) connected as a diode, this combination then comprising the gated current-generating device 43, shown in FIG. 1, for producing the RESTORE CURRENT. Also in this embodiment, the current-generating device 10 is an ion chamber 9 with its 250-V bias supply 38 as used in radiation dosimetry. This ion chamber 9 when exposed to dose rates from 1 mR/min to 6000 R/min produces an INPUT CURRENT of about $3 \times 10^{-14}$ A at 1 mR/min. Total exposures will range between 0.02 mR and 13 R, corresponding to input charges between $3.6 \times 10^{-14}$ C and $2.4 \times 10^{-8}$ C.

The current from ion chamber 9 enters the current-to-frequency converter 32 through a 10-MΩ resistor 36. This resistor 36 limits the INPUT CURRENT in the event of an inadvertent ion-chamber 9 short circuit or arc to about 30 μA, which, because of the clamping action of diode 30 and capacitor 24, cannot damage the charge amplifier 11. Additionally, the 300-μs smoothing time constant caused by the 30-pF ion-chamber 9 and cable 47 capacitance and resistor 36 will hold the INPUT CURRENT below the 0.18-μA full-scale value even if 50 pC were to be applied suddenly to the input. Thus, the input network will maintain the circuit within its linear operating range for such current "spikes," as well as protecting it against arcs from the ion-chamber 9 or high-voltage supply 38, while producing an acceptable 0.3-ms time delay. It also will strongly attenuate any high-frequency ripple present on the 250-V supply 38.

The INPUT CURRENT then enters the charge amplifier 11 with a transfer capacitance given approximately by the 0.25-pF value of the feedback capacitor 14. Except during the reset or restore sequences when the restoration diode 30 conducts, this amplifier 11 functions as a standard charge-sensitive amplifier with capacitive feedback from the output to the inverting input. Because the overall feedback loop of the converter 32 contains the amplifier 11, its transfer capacitance needs to be only moderately stable and predictable.

In order to reduce input leakage current as much as possible, the input stage of the operational amplifier 12, which provides the gain for the charge amplifier 11, is a dual MOSFET 34 containing individual matched transistors 46 and 48. Because the current-to-frequency converter 32 automatically nulls out any voltage offsets during the reset sequence, the offset voltage of the charge amplifier 11 is not particularly critical. This advantage is indeed fortunate in that the threshold signal level of $3.6 \times 10^{-14}$ C represents a voltage of only 24 μV across the 1500-pF capacitor 24 connected to the input. Because this voltage accuracy cannot be maintained using MOSFETs except for short periods of time, other configurations would require the complexity of automatic or manual zero-correcting circuits or range switches. Transistor 50, diode 52 and resistors 51, 53 and 54 provide a temperature-compensated operating current for the dual MOSFET 34.

An integrated-circuit or discrete-component amplifier 40 provides the necessary gain to obtain a closed-loop rise time sufficiently fast to allow the charge amplifier 11 to respond on a pulse-by-pulse basis even when charge pulses are applid at a 5-MHz rate. Additionally, amplifier 40 maintains nearly equal voltages across resistors 42 and 44, balancing the drain currents of MOSFETs 46 and 48 for equal values for resistors 42 and 44. Proper choice of the values of resistors 51, 42 and 44 then allows the input stage 34 to operate with only a small gate-drain voltage. Because MOSFETs 46 and 48 are a matched pair, balancing their drain currents and voltages makes their gate-source voltages approximately equal, resulting in the input operating near ground potential.

With only small voltages across diode 30 or from gate to drain of MOSFET 46, one of the principal sources of input leakage current results from the finite resistance between the gate and the source and body of MOSFET 46. This resistance in one embodiment generally reaches $4 \times 10^{15}$ Ω for MOSFET 46, producing an offset current of $1 \times 10^{-15}$ A for the typical 4-V gate-source potential. Furthermore, the use of a junction FET 30 connected as a diode provides a typical leakage resistance to ground at the input of $2 \times 10^{13}$ Ω, so long as the RESET* and RESTORE* signals are near +8-V, holding diodes 31 and 61 out of conduction. This leakage conductance will dominate other leakage paths at the input so long as the input contacts only high-resistivity materials, such as polytetrafluoroethylene, and is carefully guarded by grounded shields from conductors at other than ground potential. If the matching of MOSFETs 46 and 48 maintains the input within ±20 mV of ground, these leakage paths will contribute $\pm 1 \times 10^{-15}$ A to the offset current. Finally the input MOSFET 46 drain is about −1 V with respect to its gate, generating leakage current of about $-0.25 \times 10^{-15}$ A. The total of these leakage currents ranges between $-0.25 \times 10^{-15}$ A and $1.75 \times 10^{-15}$ A, indicating that negative leakage currents may be present at the input to the converter 32.

Capacitor 24 of the capacitive divider 13 is also connected to the charge-amplifier 11 input and in one embodiment couples 1/4530 of the charge output of the charge pulser 15 into the charge amplifier 11. Each pulse from the charge pulser 15 then contains 166 pC, so that 36.6 fC reaches the charge-amplifier 11 input through capacitor 24. In response to each such pulse, the CHARGE SIGNAL at the output of the charge amplifier 11 will rise 91 mV owing to its 0.25-pF transfer capacitance. In addition, slow drifts of the gate-source voltage of the input MOSFET 46 with respect to the reference MOSFET 48 cause an effective current flow proportional to the total capacitance at the converter 32 input, including the 1500-pF divider capacitor 24. A drift rate of ±1 μV/s is equivalent to a leakage current of $\pm 1.5 \times 10^{-15}$ A, adding to the probability that the total input leakage current becomes negative.

The leakage currents of transistors 22 and 28 also contribute to the effective input leakage after being multiplied by the ratio of the capacitance of capacitor 24 to the sum of the capacitances of capacitors 24 and 26. In one embodiment this ratio is 1/4530, and the resultant equivalent input leakage current becomes $4 \times 10^{-15}$ A. However, this effective leakage current does not add a charge to the converter 32 input which is not removed just by saturating the reset transistor 28. The other leakage effects, as will be discussed later, can add a net negative charge to the input which is not removed by saturating the reset transistor 28. The maximum offset current of $6 \times 10^{-15}$ A is sufficiently small compared to the $3 \times 10^{-14}$-A threshold current so that an offset-current adjustment is not necessary if, as described later, the cumulative effects of negative leakage are nullified by a proper restore cycle, which may be a part of each reset cycle.

The CHARGE SIGNAL produced by the charge amplifier 11 enters the gated multivibrator through the gating circuit consisting of diodes 56 and 68 and resistor 57. Except during the reset sequence, the RESET* signal produced by the data processor 18 has a value near +8 V, permitting the CHARGE SIGNAL to saturate transistor 65 whenever the signal level exceeds the threshold near 0.6 V. In that case with no INPUT CURRENT preset, the output of nor gate 58 is high, with the output of inverter 60 low, because both inputs to gate 58 are low. The CHARGE-DRIVE signals thus remain fixed, and no feedback charge passes through transistor 22, leaving the CHARGE SIGNAL constant. If an ion-chamber 9 current then begins and causes the CHARGE SIGNAL to fall by about 25 mV, transistor 65 stops conducting, and the collector of transistor 65 starts to rise toward +8 V. After 0.1 μs the output of gate 58 changes state, producing a negative transition in the CHARGE-DRIVE* signal. This negative transition results in a low-to-high transition of CHARGE DRIVE after inversion by inverter 60. This transition coupled through capacitor 64 to one input of gate 58 temporarily holds the output of gate 58 low even if transistor 65 saturates. In fact, this same signal coupled through resistors 49 and 59 saturates transistor 65, causing the capacitance at the collector of transistor 65 to decay toward ground potential.

After 0.1 μs from the positive transition of the CHARGE-DRIVE signal, the voltage on the gate 58 side of capacitor 64 decays sufficiently through resistor 59 so that the output of gate 58 returns to the high state, causing the output of inverter 60 to fall to the low state. This transition will cut off transistor 65 because of the currents in resistors 49, 55 and 59, permitting its collector to rise, only if the CHARGE SIGNAL is still below the base-emitter threshold voltage of transistor 65. In this case, the collector voltage of transistor 65 will rise to the threshold voltage of gate 58 in 0.1 μs, at which time the above-described sequence repeats. Thus, so long as the CHARGE SIGNAL remains below the threshold voltage of transistor 65, the gated multivibrator 16 will generate 5-MHz square wave at both its CHARGE-DRIVE and CHARGE-DRIVE* outputs.

The CHARGE-DRIVE signals enter the charge pulser 15 through inverter 17, which has a variable supply voltage called $V_{REF}$. When the CHARGE-DRIVE signal makes a positive transition, the output voltage from inverter 17 makes a negative transition with an amplitude determined by $V_{REF}$. Because the gain of the converter 32 is proportional to the amplitude of this transition, varying $V_{REF}$ appropriately can provide compensation for changes in pressure or temperature in the ion chamber 9.

The signals from inverter 17 proceed through variable capacitor 20 to the emitter of transistor 22. The end of capacitor 20 connected to the emitter of transistor 22 normally rests slightly above −20 V owing to the conduction of diode 21 as a result of the current in resistor 45. When the signal at the output of inverter 17 makes a negative transition, diode 21 stops conducting, and capacitor 20 charges negatively through the emitter of transistor 22, drawing out a charge equal approximately to the magnitude of $V_{REF}$ multiplied by the capacitance of capacitor 20. When the CHARGE-DRIVE signal returns to ground potential, the charge on capacitor 20 is restored through diode 21. In this manner, each CHARGE-DRIVE pulse transfers nominally 166 pC to the collector of transistor 22. Except during the reset sequence, the RESET* signal supplies sufficient current through resistor 27 to exceed the current in resistor 23, forcing diode 19 into conduction and cutting off transistor 28. As a result, all of the charge reaching the collector of transistor 22 proceeds to the capacitive divider 13, causing a pulse containing 36.6 fC as part of the FEEDBACK CURRENT to be removed from the input of the charge amplifier 11.

This signal propagates through the charge amplifier 11 to the base of transistor 65 in the gated multivibrator 16. When a sufficient amount of charge has been transferred to the charge-amplifier 11 input to cause the CHARGE SIGNAL to rise above the emitter-base threshold voltage of transistor 65, that transistor 65 saturates. So long as transistor 65 is saturated, the gated multivibrator 16 ceases to produce output pulses. When the CHARGE SIGNAL subsequently decays below the threshold voltage of transistor 65, the gated multivibrator 16 will produce an output pulse 0.1-μs later. Thus the number of these pulses is precisely proportional to the ion-chamber 9 charge within the 36.6-fc resolution given by the magnitude of the discrete feedback charge. The exact waveform of the FEEDBACK CURRENT is not critical in that the sensitivity of the converter 32 depends only on the total charge transferred, which in turn depends mainly on the stable values of capacitors 24, 26 and 20 and of $V_{REF}$. Adjustment of variable capacitor 20 allows the converter 32 to be calibrated easily to eliminate the effects of component tolerances.

This action causes the voltage at the collector of transistor 22 to fall negatively. In one embodiment, the values of capacitors 20, 24 and 26 are chosen such that each pulse draws nominally 36.6 fC from the charge-amplifier 11 input, causing the voltage across capacitor 24 and thus at the collector of transistor 22 to fall by 24.4 μV. When the maximum input charge is 24 nC, corresponding to a radiation dose of 13 R and 650,000 pulses, then the collector of transistor 22 must be able to fall by at least 15.4 V.

In order to avoid saturation of transistor 22, capacitors 24 and 26 must be occasionally discharged by saturating transistor 28. During the first 2 ms of this reset sequence, the RESET* signal falls to ground potential, and the resulting currents in capacitor 25 and resistor 23 hold transistor 28 in conduction. As a result, the voltage at the collector of transistor 22 returns to ground potential, forcing a positive current through capacitor 24 into the charge amplifier 11. This relatively large current places diode 30 in conduction, which provides a dc path for the recharging of capacitor 24 through resistor 29.

This sequence occurs whenever the voltage at the collector of the reset transistor 28 has decreased more than the voltage at the input to the converter 32 because the total charge entering the converter 32 during its normal operating period is positive. However, for the case where the INPUT CURRENT is smaller in magnitude than a negative effective input leakage current, including voltage changes in the input MOSFETs 34 but not including leakage of transistors 28 and 22, then the saturation of the reset transistor 28 will not force the restoration diode 30 to conduct, because the converter will not have been producing CHARGE-DRIVE pulses and thus the voltage at the collector of the reset transistor 28 will not have moved negatively before the RESET* pulse saturated transistor 28. The resulting failure of the restoration diode 30 to conduct means that the converter 32 does not reestablish its proper operating level, and a negative offset charge now exists. As long as the negative offset currents exceed in magnitude the input current, this negative offset continues to accumulate, even though the converter 32 is repetitively reset. An INPUT CURRENT then must deliver a sufficient amount of positive charge to the converter 32 to overcome this cumulative negative offset and restore the converter 32 to normal operation. The converter 32 will not generate CHARGE-DRIVE* pulses in response to this initial offset-cancelling charge, and thus it will not be included in the total charge measurement, adding to the converter 32 errors.

In order to avoid this error source, it is desirable to introduce a relatively large positive current at the converter 32 input during periods when the data processor 18 is already ignoring CHARGE-DRIVE* pulses. Then this RESTORE CURRENT can recharge the capacitance at the converter 32 input and force the restoration diode 30 into conduction, to reestablish the proper operating level of the converter even for negative leakage currents. Because the current required to recharge the input capacitance does not come from the INPUT CURRENT, this restoration technique eliminates the errors in measuring input charge and current caused by cumulative negative offsets.

One simple method for generating this RESTORE CURRENT involves shining light on the restoration diode 30. This light will generate charge carriers within the diode junction, and as a result the diode 30 becomes essentially conductive in both directions. Thus, if the input voltage of the converter 32 is negative so that the diode 30 would normally not conduct, this exposure to light will cause the diode to charge the capacitance at the converter 32 input positively, thus generating the RESTORE CURRENT. Additionally, if the converter 32 is in its normal operating state, the photocurrents in the restoration diode 30 will generate an effective input current, which can be used for calibrating and checking the converter 32.

One method for generating a light pulse of precisely known duration involves the passage of a current pulse of that duration through a light-emitting diode (LED). In the preferred embodiment, the LED 61 was mounted in the same enclosure 62 as the restoration diode 30 so that its light was efficiently coupled to the diode 30. Resistor 63 and the magnitude of the RESTORE* pulse determine the current in the LED 61 and thus its light output. In one embodiment a current of 5 mA produced a RESTORE CURRENT of 20 nA.

In one of the preferred embodiments, the RESTORE* signal produces a current in the LED 61 whenever the RESET* places the converter 32 in the reset state during a normal measurement cycle. During this period the output of amplifier 40 falls to near ground potential. Because RESET* is also near ground potential at that time, the current in resistor 35 flows in diode 31 instead of in diode 33 as was the case when the RESET* signal was high. The presence of this current in resistor 29 depresses the voltage at the cathode of diode 30, allowing it to discharge capacitor 24 in either direction until the voltage at the converter 32 input nearly reaches the threshold voltage of the charge amplifier 11.

At that time the output voltage of amplifier 40 will rise, causing the current in resistor 35 to flow partly in diodes 33 and 39 in such a way as to hold the voltage at the input of the charge amplifier 11 near its threshold value. The voltage at the cathode of the restoration diode 30 will be below the converter 32 input by a few tenths of a volt as determined by the open-circuit voltage of diode 30 acting as a photodiode. The charge carriers generated in the diode by the light will reduce its impedance at this time only, making the above-described secondary feedback faster while preserving the high impedance necessary for low leakage in the standard operating state of the converter 32. During this period the absence of voltage across resistor 66 prevents the gated multivibrator 16 from generating CHARGE-DRIVE pulses.

After 2 ms have passed, the data processor 18 returns the RESET* and the RESTORE* signals to their high states. This action opens the secondary feedback loop through diode 30 by forcing diodes 61, 31 and 39 out of conduction as a result of the current in resistors 35 and 37, and restores normal operation of the gated multivibrator 16 and charge pulser 15 with the voltage at the input to the charge amplifier 11 slightly above its quiescent value. The total digitizer loop is now closed in its standard mode. As a result, the charge pulser 15 will now produce a sufficient number of charge pulses to bring the voltage at the output of the charge amplifier 11 to a point just above the threshold of the gated multivibrator 16, thus automatically establishing the proper voltage at the input to the charge amplifier 11 and compensating for the small differences in the gate-source voltages of MOSFETs 46 and 48. During this recovery period lasting about 0.1 ms at the end of the reset sequence, the data processor 18 ignores the CHARGE-DRIVE* output of the gated multivibrator 16 in order that changes in the number of pulses produced in the recovery process do not change the results obtained from digitizing an INPUT CURRENT.

The above-described short reset cycle need not occur just between normal measurements. A longer reset cycle may also occur at other times, such as at instrument turn on or after changing ion chambers, when large negative charges may have been introduced at the converter 32 input. In that case the RESTORE CURRENT may have to flow for times longer than 2 ms in order to discharge completely the capacitance at the converter 32 input. Thus the data processor 18 may upon occasion command a longer reset cycle than that normally needed to correct for small negative leakage currents. In one embodiment, this longer reset cycle lasts 0.25 s.

Furthermore, the RESTORE* pulse could be low with the RESET* pulse high, resulting in the RESTORE CURRENT being present with the converter 32 in the normal operating mode. In that case the data processor will receive CHARGE-DRIVE* pulses representing the sum of the INPUT and RESTORE CURRENTS. This mode can be used to calibrate and otherwise check the converter 32 for proper operation. It can also be used to remove negative charges from the converter input.

In one embodiment of this circuit, the total power consumption from power supplies 41 while digitizing low-level signals was 38 mW, falling to 16 mW during the reset sequence without RESTORE CURRENT, which was also used as a standby mode. During periods when the CHARGE-DRIVE* signals were appearing at a 5 MHz rate and were traveling over a coaxial cable with a 6-m (20-ft.) length, the operating power increased to 153 mW. These power levels show that this digitizer is consistent with small, portable, battery-powered instruments. Noise levels were such that the rms variations in the charge measured 1.2 s were about ±30 fC.

What is claimed as new is:

1. For use in combination in a circuit for digitizing unipolar signal currents, an improved current-to-frequency converter comprising:
    (a) amplifier means, adapted to receive an input current having a signal current, a restoration current and repetitive discrete feedback charge pulses, for providing a comparison between the charge arising from the signal plus restoration currents and the total discrete feedback charge, and for producing an output voltage proportional to the difference between the total feedback charge and the total charge produced by the signal and restoration currents;
    (b) charge-generating means, connected to the output of the amplifier means, for producing known amounts of charge at a charge output whenever the amplifier means indicates that the feedback charge has a smaller absolute magnitude than the signal plus restoration charges, and for producing at those times output pulses whose repetition rate becomes an output frequency signal;
    (c) capacitive-divider means, connected between the charge output of the charge-generating means and the input to the amplifier means, for attenuating the charge generated by the charge-generating means, to produce said repetitive discrete feedback charge pulses;
    (d) pulse-generating means connected to the charge-generating means, said pulse-generating means producing pulses which cause the capacitive-divider means to be discharged in such a fashion that the current-to-frequency converter establishes its own zero level; and
    (e) restoration-current means; connected to the input of the amplifier means, said restoration-current means generating on command a current flowing in the same direction as the signal current;
    whereby, analog-to-digital conversion is accomplished by producing a train of pulses at the frequency output with a repetition frequency related in a known way to the total current applied to the input of the current-to-frequency converter.

2. The circuit of claim 1, above, wherein the restoration-current means generates on command a flow of current during the time when the pulse-generating means is discharging the capacitive-divider means and when the output frequency is not being measured,
    whereby, the cumulative effects of any leakage currents at the input to the amplifier means with a polarity opposite to that of the signal current are nullified without generating errors in the measurement of the signal current.

3. The circuit of claim 1, above, wherein the restoration-current means generates on command a flow of current during the time when the converter is producing a train of pulses at the frequency output in response to a signal current, said restoration-current means producing a known change in the output frequency, whereby, the proper operation of the converter can be ascertained.

4. The circuit of claim 1, above, wherein the restoration-current means comprises:

(a) a junction diode connected to the input of the amplifier means; and (b) a commandable light-generating means for exposing the diode junction to light, causing the diode to generate photocurrents of the same polarity at the signal current, whereby, the junction diode produces on command a current flowing in the same direction as the signal current.

5. The circuit of claim 4, above, wherein the light-generating means comprises a light-emitting diode and a commandable source of current, said current causing the light-emitting diode to generate light, whereby the light-generating means produces light on command.

6. The circuit of claim 5, above, wherein the junction diode connected to the input of the amplifier means and the light-emitting diode are enclosed in the same package, with the relative placement of these components efficiently coupling the light from the light-emitting diode to the diode junction, whereby, the current produced by the junction diode owing to its exposure to light is maximized for a fixed current in the light-emitting diode.

7. The circuit of claim 4, above, wherein the junction diode forms a part of a secondary feedback path connected between the input and the output of the amplifier means, the feedback maintaining the amplifier means in a balanced state during the time when the pulse-generating means is causing the capacitive-divider means to be discharged, the exposure of the junction diode to light at that time reducing its impedance and thus the impedance of the entire secondary feedback path, whereby, the operation of the secondary feedback path becomes more rapid.

8. The circuit of claim 1, above, wherein the restoration-current means comprises a mechanical switch and a resistor connected to a source of potential.

* * * * *